United States Patent [19]

Maudsley

[11] Patent Number: 4,689,566

[45] Date of Patent: Aug. 25, 1987

[54] NMR PHASE ENCODING USING PHASE VARYING RF PULSES

[75] Inventor: Andrew A. Maudsley, New York, N.Y.

[73] Assignee: Advanced NMR Systems, Inc., Woburn, Mass.

[21] Appl. No.: 756,035

[22] Filed: Jul. 17, 1985

[51] Int. Cl.⁴ ............................................. G01R 33/20
[52] U.S. Cl. ...................................... 324/309; 324/313
[58] Field of Search ............... 324/307, 309, 310, 311, 324/313

[56] References Cited

U.S. PATENT DOCUMENTS

| | | | |
|---|---|---|---|
| 4,486,709 | 12/1984 | Bendall | 324/309 |
| 4,520,315 | 5/1985 | Loeffler et al. | 324/309 |
| 4,528,509 | 7/1985 | Radda et al. | 324/309 |

FOREIGN PATENT DOCUMENTS 2150303  6/1985  United Kingdom ................ 324/307

OTHER PUBLICATIONS

D. I. Hoult, "Rotating Frame Zuegmatography" Journal of Magnetic Resonance, vol. 33 (1979) pp. 183–197.
P. Mansfield et al, "Fast Scan Proton Density Imaging by NMR", Journal of Physics E. Scientific Instruments, vol. 9 (1976) pp. 271–278.
C. H. Oh, et al "Line–Intrical Projection Reconstruction . . . " IEEE Trans. Medical Imaging, vol. 3 (1984), pp. 170–178.
A. A. Maudsley, "Multiple–Line Scanning Spin Density Imaging" Journal of Magnetic Resonance, vol. 41 (1980), pp. 112–126.
Z. H. Cho, et al, "Echo–Time Encoded Chemical Shift NMR Spectroscopic Imaging Techniquie", presented at the Society of Magnetic Resonance and Medicine, New York, Aug. 1984, pp. 155–156.
M. Garwood et al, "Spatial Localization . . . ", Journal of Magnetic Resonance, vol. 60 (1984), pp. 268–279.
J. F. Martin, Communications—"Chemical–Shift Encoding in NMR Images" Journal of Magnetic Resonance, vol. 61 (1985), pp. 153–157.
W. T. Dixon, "Simple Proton Spectroscopic Imaging" Radiology, vol. 153 (1984) pp. 189–194.

Primary Examiner—Stewart J. Levy
Assistant Examiner—Scott M. Oldham
Attorney, Agent, or Firm—Ostrolenk, Faber, Gerb & Soffen

[57] ABSTRACT

The phase encoding of NMR information is performed using rf pulse sequences. The rf pulse sequences produce a substantially continuous phase variation cross the resonant frequency range of the atoms of an object in order to perform phase encoding. Some of the pulses may be tailored pulses, with each tailored rf pulse including frequencies which cover a bounded continuous frequency range. Either the phase or the amplitude of each tailored rf pulse varies with frequency across this continuous range. If the amplitude is linearly variant across the range, the phase is constant, but if the phase is linearly variant across the range, the amplitude is constant. The tailored rf pulses may be applied in the presence of pulsed magnetic gradient fields of the conventional type to produce the phase variation. Alternatively, rf pulses may be applied through rf field gradient coils providing a spatial variation which permits may in either case be included in a sequence of pulses which also performs excitation of atoms in an object being imaged.

14 Claims, 13 Drawing Figures

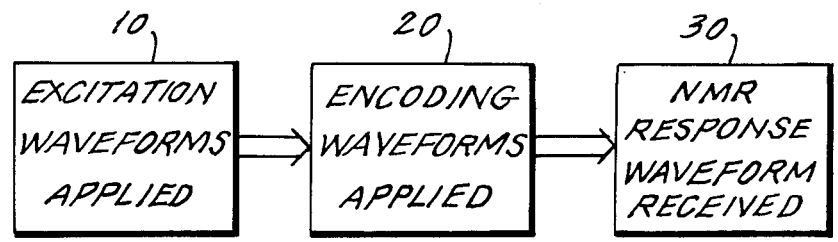
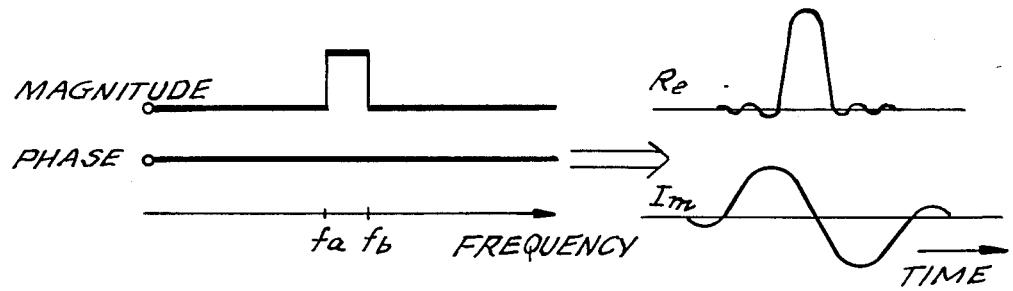
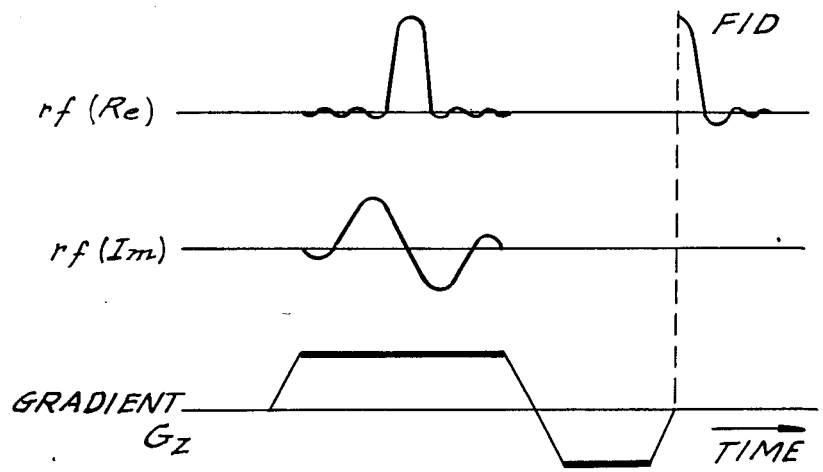

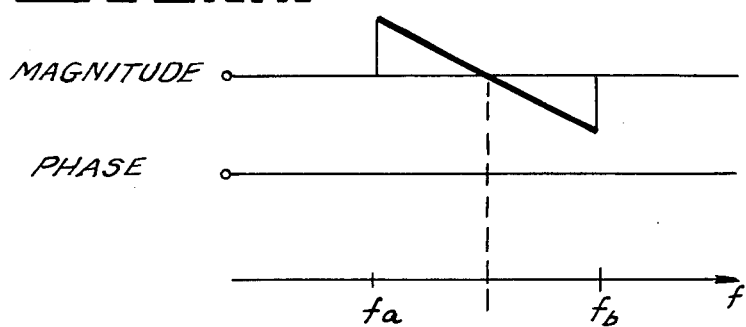
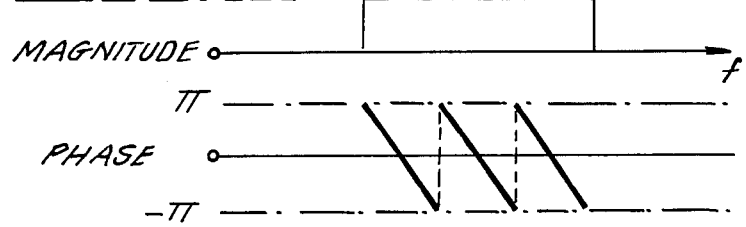
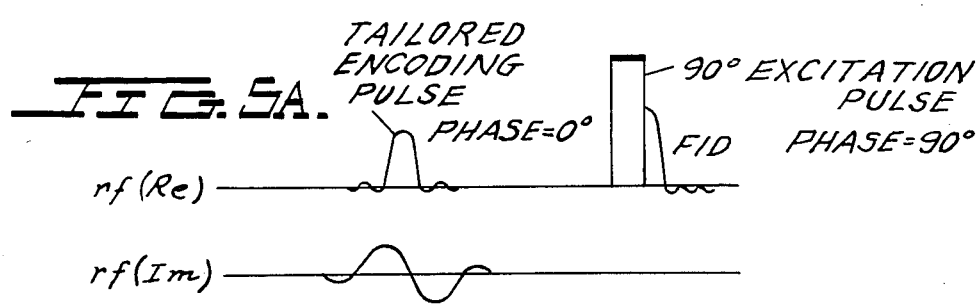
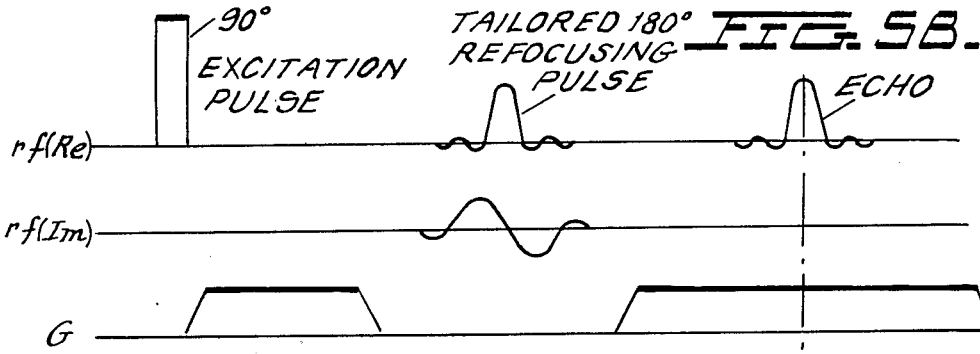

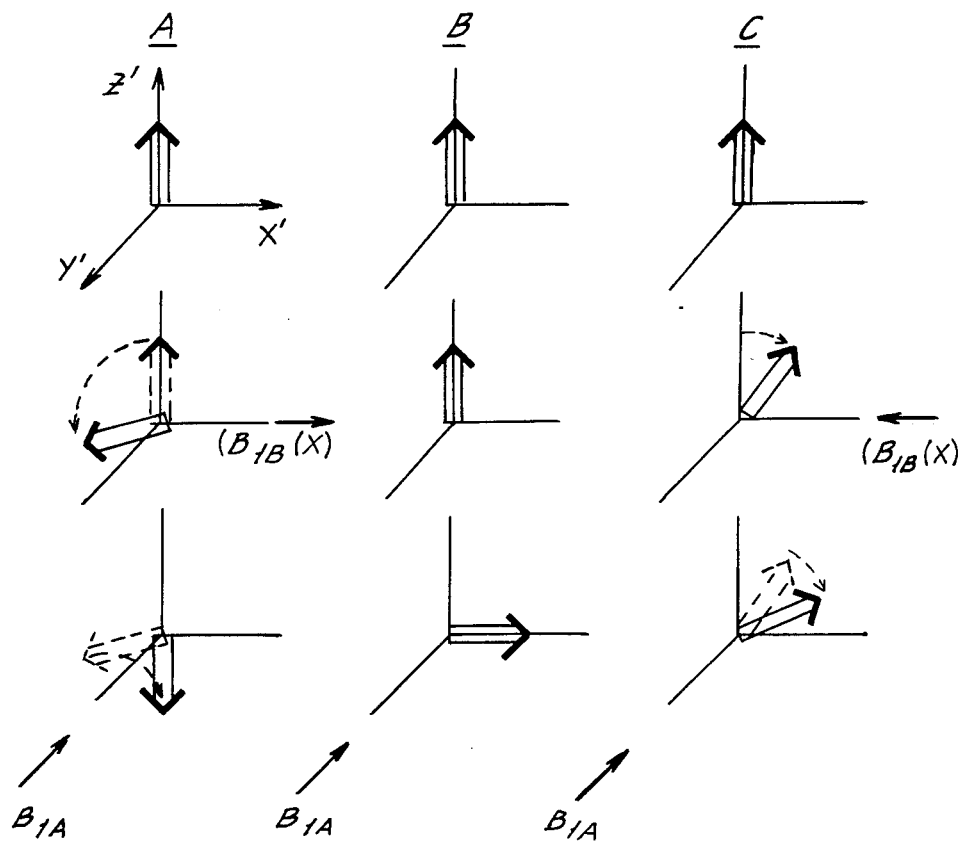

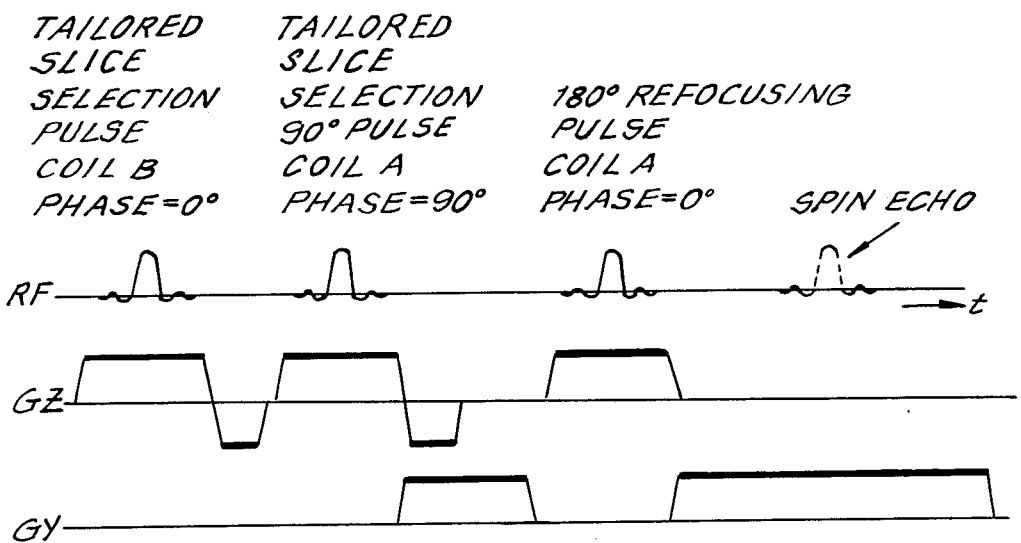
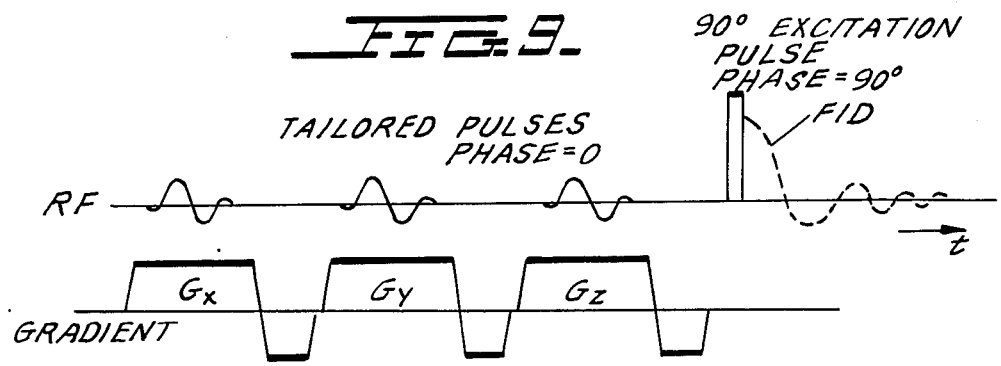
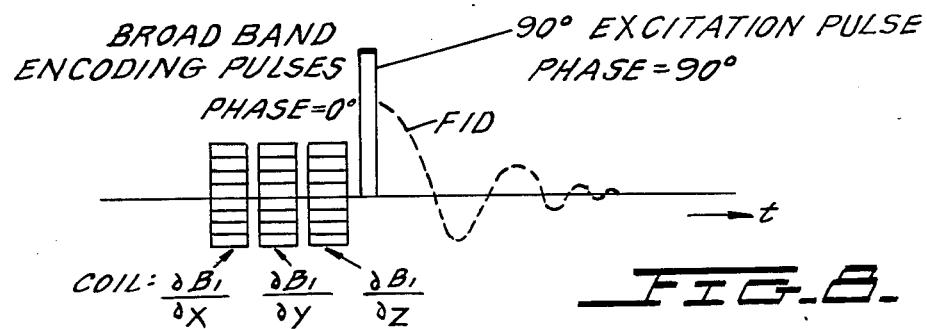

NMR PHASE ENCODING USING PHASE VARYING RF PULSES

BACKGROUND OF THE INVENTION

1. Field of the Invention

This invention relates to techniques for obtaining nuclear magnetic resonance (NMR) information from an object. More specifically, this invention relates to techniques for encoding information into the phase of a received NMR signal.

2. Description of the Prior Art

NMR information about an object is ordinarily obtained by receiving a single time-varying radio frequency (rf) signal. In imaging, for example, this time-varying rf signal must provide the necessary information about the object being imaged, such as a human body. Therefore, the characteristics of this time-varying signal must somehow be modulated by the atomic nuclei in the object to provide information about those nuclei. For example, in Fourier imaging, the distribution of nuclei of a particular element is typically encoded into the phase and amplitude of the received time-varying signal. Various techniques have been developed for enabling the nuclei to encode information into the received signal.

The most common use of phase encoding in NMR imaging is to encode information about the spatial location of atomic nuclei having a particular resonance. Such nuclei are initially excited into a resonant state from which they decay according to an appropriate time constant. While in the excited state, the nuclei may be phase encoded by the application of a relatively low frequency pulsed magnetic field gradient. The effect of the low frequency gradient is to change the phase of the decay, but because the gradient varies across a spatial dimension, the amount of phase change varies according to the position of the nuclei, so that the resulting phases of the nuclei provide the desired spatial information. Several variations of this technique have been used, including the application of a range of field gradients having various amplitudes, and the application of a series of field gradient pulses during a series of echoing NMR signals to produce increasing amounts of phase encoding. Each of these variations can be used to obtain a two or three dimensional data set which may be Fourier transformed into a two or three dimensional spatial distribution of the excited nuclei. If the NMR signals themselves are received in the absence of any applied field gradient, but after phase encoding in all resolved spatial dimensions, spectroscopic frequency information about the nuclei at each spatial location will be received, indicating chemical shift information or field inhomogeneity information about the resonant atoms at that location.

Another technique, referred to herein as the echo-time encoded method, phase encodes spectroscopic information by changing the timing of one or more refocusing pulses in a pulse and gradient switching sequence which produces a series of spin echoes. The sequence also includes the application of an observation gradient during the echoing NMR signals, so that the refocusing of the nuclear spins is determined by the combination of the refocusing pulse and the observation gradient. A mismatch of the timing of these signals results in a phase change of the received NMR signal which evolves during the observation gradient and which depends on the frequency difference between the spin resonance of the nucleus and the reference frequency absent applied field gradients. This technique makes it possible to separate two chemically shifted systems such as lipids and water having the same resonant nucleus, in this case protons, but different resonant frequencies, and successive applications of the mistimed refocusing pulses make it possible to obtain more detailed spectral discrimination.

Other techniques of encoding use rf pulses with spectra which include discrete frequency bands, but accurate generation of such spectra is difficult in practice. Also, continuous coverage of the complete range of resonant frequencies of an object requires more than one measurement, due to the gaps in the spectra.

A number of techniques have also been developed for amplitude encoding of information, some of which are discussed below. Amplitude encoding, however, suffers a loss of sensitivity compared with phase encoding, so that phase encoding is often preferable.

Most of the above-described techniques of phase encoding depend heavily upon the application of pulsed magnetic gradient fields. These gradient fields are typically applied by gradient coils which have a number of problems, including audio frequency vibrations, high power supply requirements, and heavy duty switching requirements. It would be advantageous to provide phase encoding techniques which could be used without gradient fields. More generally, it would be advantageous to provide phase encoding techniques which would produce a continuous phase variation across the entire range of resonant frequencies using an rf pulse, providing greater flexibility than has previously been available.

SUMMARY OF THE INVENTION

The present invention generally provides techniques for phase encoding in which an rf pulse produces a generally continuous phase variation across the range of resonant frequencies of the atomic nuclei which provide an NMR signal. One aspect of the present invention provides techniques for phase encoding which make it possible to perform phase encoding without applying low frequency pulsed magnetic gradient fields. The present invention thus makes it possible to perform phase encoding on conventional high resolution spectrometers without adding gradient coils of the type described above. The present invention further provides phase encoding techniques which can be used on conventional NMR imaging systems with gradient coils to provide added versatility.

In general, the present invention is based on the discovery that phase encoding of NMR information may be performed using sequences of rf pulses which produces a substantially continuous phase variation across the resonant frequency range of the atoms of an object. One aspect of the present invention is based on the further discovery that tailored rf pulses with either phase or amplitude spectra which vary with frequency may be used in the phase encoding of NMR information in a received signal. Another aspect of the present invention is based on the discovery that rf pulses which bring the atomic nuclei into the excited state may also be used in phase encoding. In addition, rf field gradients produced by inhomogeneous rf coils may be used in a sequence to perform phase encoding during excitation without the application of pulsed magnetic gradient fields.

A method of retrieving phase encoded NMR information from an object according to the present invention includes phase encoding nuclei in the object to provide a phase encoded NMR signal and receiving the phase encoded NMR signal. The phase encoding includes applying an rf pulse with a subsantially continuous frequency range covering a range of resonant frequencies of the nuclei and also includes producing a substantially continuous phase variation across the range of resonant frequencies.

The rf pulse used in phase encoding may be a tailored pulse with either its magnitude or its phase varying linearly with frequency across a continuous range. The rf pulse may be generated by defining its magnitude and phase spectra, transforming them to obtain time-varying real and imaginary components, and applying the rf pulse modulated by the real and imaginary components.

The rf pulse may be applied through an inhomogeneous coil to produce an rf gradient field across the object, and the gradient field may have a null point within the object. In one embodiment, a tailored rf pulse with a linearly varying magnitude is applied through the inhomogeneous coil.

Other objects, features and advantages will be apparent from the following description, together with the accompanying drawings and the appended claims.

BRIEF DESCRIPTION OF THE DRAWINGS

FIG. 1 is a flow chart showing a sequence of operations in NMR information retrieval.

FIG. 2 shows spectral graphs and schematic real and imaginary components of a pulse used in the prior art during NMR information retrieval.

FIG. 3 is a timing diagram showing a pulse sequence for NMR imaging using the tailored pulse of FIG. 2.

FIGS. 4A and 4B are spectral graphs showing the amplitude and phase spectra of two tailored rf pulses for use in phase encoding sequences according to the present invention.

FIG. 5A is a timing diagram showing the application of a tailored rf pulse in a phase encoding sequence.

FIG. 5B is a timing diagram showing the application of another tailored rf pulse in a phase encoding sequence.

FIG. 7 is a schematic diagram showing the effect upon the nuclear spin magnetization of the application of the rf pulse sequence of FIG. 6B.

FIG. 8 shows a pulse sequence for performing NMR imaging without the application of pulsed magnetic gradient fields.

FIG. 9 shows another pulse sequence for NMR imaging in which tailored rf pulses may be used with pulsed magnetic gradient fields.

FIG. 10 shows a pulse sequence for two dimensional NMR imaging using tailored rf excitation pulses and rf field gradients.

DETAILED DESCRIPTION OF THE PREFERRED EMBODIMENT

I. Background

Figure 6A:
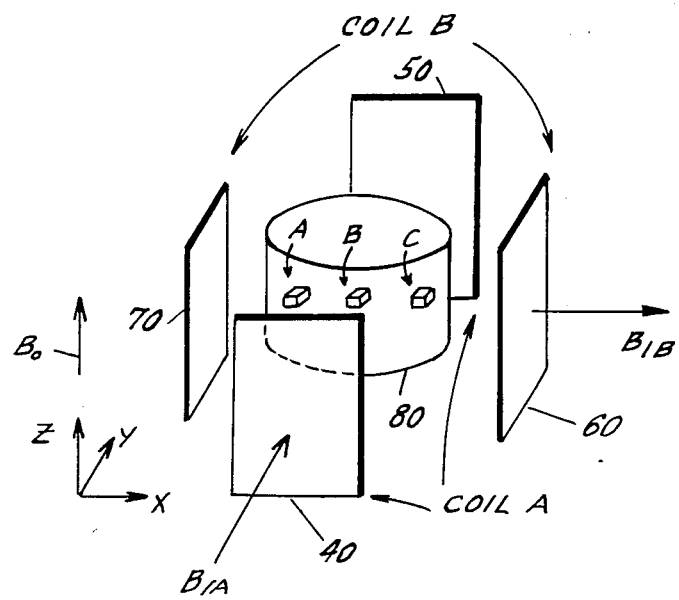
FIG. 6A is a schematic diagram showing an arrangement of rf coils for the application of rf pulses.

In order to understand the present invention, it is helpful to review some general aspects of NMR information retrieval. It is also helpful to consider an example of how tailored rf pulses have been used in the prior art.

FIG. 1 sets forth in flow diagram form the fundamental functions performed during NMR information retrieval. In box 10, excitation waveforms are applied to an object in order to bring at least some of the atomic nuclei of the object into an excited state. The excitation waveforms are typically applied in the presence of a static magnetic field which establishes a reference resonant frequency $f_O$, around which the resonance frequencies of the nuclei vary across a range due to chemical shift and field inhomogeneity, but may also include pulsed magnetic gradient fields which cause the resonance frequencies to vary across a range due to location. The excitation waveforms include appropriate rf pulses for exciting at least some of the atomic nuclei in the object into an excited state from which they will precess to provide an NMR signal. This may be done by tipping all of the spin magnetization axes of the atoms of an object into a focused position from which they precess, resulting in a decaying NMR signal. In addition, additional waveforms may be applied to cause the spin magnetizations to refocus in order to obtain additional echoing NMR signals.

In box 20, encoding waveforms are applied to the object in order to encode information into the NMR signals. This may be done by encoding the spin magnetizations of the excited atomic nuclei with information relating to their spatial location, the chemical shift of their resonant frequency from $f_O$ or the inhomogeneity of the static field. Although FIG. 1 shows the encoding in box 20 occurring after the excitation in box 10, this is only illustrative, and one aspect of the present invention makes it possible for phase encoding to occur during an rf excitation pulse sequence.

In boxes 10 and 20, the waveforms which are applied interact with the nuclei of the object to produce the desired effects. In general, each nucleus may be thought of as a spin system which is resonant at a frequency which depends on its makeup and on the local magnetic field. Therefore each spin system, in effect, will only receive those input waveforms which are received at its resonant frequency. The phase and amplitude of the waveforms at that frequency will determine the subsequent response of that spin system. Therefore, the waveforms applied in boxes 10 and 20 may include waveforms which establish the local magnetic field in addition to the waveforms which perform excitation and encoding of information about the spin system.

In box 30, as a result of the waveforms applied in boxes 10 and 20, an NMR response waveform is generated. This waveform occurs as the spin systems of the atomic nuclei in the object precess and decay from their excited state. The decay processes provide a waveform which may be received by an rf coil, detected with reference to a reference frequency, sampled, and stored in a data set for subsequent processing. If both amplitude and phase information are obtained, it may be possible to perform Fourier imaging by transforming the data set to obtain an image. Other techniques such as projection reconstruction may also be used to obtain an image from the data set. Even if the received NMR signal waveform does not include spatial information, it may be used to obtain spectroscopic information about an object. In any event, the usefulness of the output waveform in box 30 depends on whether useful information has been encoded into the spin systems of the atomic nuclei in box 20.

FIGS. 2 and 3 illustrate an example of how input waveforms may be applied to an object. More specifically, FIGS. 2 and 3 illustrate how a tailored excitation, a specific type of input waveform which is used in some embodiments of the present invention, may be used in NMR imaging to select a specific part of an object to be imaged such as a slice.

FIG. 2 shows how the tailored excitation for slice selection may be defined and generated. At the left in FIG. 2 is a spectral graph of the desired excitation pulse. The spectral graph includes a magnitude spectrum and a phase spectrum, both of which cover a range of frequencies. The frequencies of interest in FIG. 2 are a narrow band of frequencies between a lower bound $f_a$ and an upper bound $f_b$. Within this band of frequencies, the magnitude spectrum has a constant value, so that for each of the frequencies between $f_a$ and $f_b$, the magnitude of the signal will be the same. The phase, however, will be zero at all frequencies so that the phase spectrum is entirely flat. By performing a Fourier transform, the magnitude and phase spectra may be transformed into the real and imaginary components shown at the right in FIG. 2. These components may be applied to the object in the manner described in P. Mansfield, A. A. Maudsley, T. Baines, "Fast Scan Proton Density Imaging by NMR", *Journal of Physics E: Scientific Instruments*, Vol. 9 (1976), pp. 271-278, at pp. 272-273 and FIG. 4. By applying an rf pulse which is modulated with both real and imaginary components as shown at the right in FIG. 2, a tailored excitation pulse will be applied to the atomic nuclei of the object whose magnitude and phase spectra are those shown at the left in FIG. 2.

FIG. 3 shows how the tailored rf pulse of FIG. 2 may be applied as a selective excitation pulse which excites only the atoms of a slice of the object. In general, the object will be subject to a static magnetic field oriented along the Z axis, and the application of a pulsed field gradient $G_z$ varying in the Z direction as shown in FIG. 3 will bias the atomic nuclei of the ojects so that the slice of nuclei at each value of z along the Z axis will have a corresponding resonant frequency $f_z$. Therefore, when the real and imaginary components of the tailored pulse shown in FIG. 2 are applied during $G_z$, as shown in FIG. 3, only those nuclei in the range in which $f_z$ is greater than $f_a$ and less than $f_b$ will be excited. This range may be described as a slice between $z_a$ and $z_b$, the values of z at which $f_z$ equals $f_a$ and $f_b$, respectively. As shown in FIG. 3, $G_z$ may then be reversed, which will result in a free induction decay (FID) signal at the time when the integral of the amplitude of the negative portion of $G_z$ is equal to one-half the integral of the amplitude of the positive portion, assuming that the tailored rf pulse was applied at the center of the positive portion of the $G_z$ gradient. This FID signal, however, will originate solely from the atoms in the selected slice of the object and, through appropriate spatial encoding, it is possible to encode the FID signal in relation to the dimensions of that slice to obtain an image of the slice.

FIGS. 2 and 3 illustrate that tailored pulses have been used as selective excitation pulses, and further variations on selective pulses are described in A. A. Maudsley, "Multiple-Line-Scanning Spin Density Imaging", *Journal of Magnetic Resonance*, Vol. 41 (1980) pp. 112-126 at 119-121. These prior techniques, however, did not recognize the possibility that a tailored rf pulse could be used in a sequence for phase encoding of NMR information, as in the present invention. As set forth below, it has been discovered that tailored rf pulses and other rf pulses may be applied in sequence for phase encoding NMR information about an object by producing a substantially continuous phase variation across the range of resonant frequencies of a set of atomic nuclei.

II. Tailored RF Encoding Pulses

FIGS. 4A and 4B are spectral diagrams showing two examples of tailored rf pulses which may be used in sequences for phase encoding of information according to the invention. These spectral diagrams are based on the discovery that a tailored rf pulse having frequencies in a bounded continuous range can be used to provide phase encoding if either the phase or magnitude is constant across that range and the other spectrum, either magnitude or phase, varies linearly across the continuous range, which covers the range of resonant frequencies of the relevant atomic nuclei.

FIG. 4A shows the amplitude or magnitude variant tailored rf pulse for use in a sequence according to the present invention. The amplitude variant pulse includes frequencies across a continuous range from the lower frequency $f_a$ to the upper frequency $f_b$. In FIG. 4A, the central frequency has zero magnitude, but the spectrum could have all positive or all negative magnitudes, provided the magnitude varies linearly across the continuous range. The phase is constant across the continuous range. If a tailored rf pulse with the spectra of FIG. 4A is applied, those nuclei for which the local magnetic field results in a resonant frequency $f_r$ slightly greater than $f_a$ will be rotated in a direction opposite those nuclei whose resonance frequency $f_r$ is slightly less than $f_b$. The nuclei which are resonant at frequencies halfway between $f_a$ and $f_b$ where the amplitude is zero will not be affected. As discussed below in relation to FIG. 7, the subsequent application of a 90° excitation pulse will result in a received NMR signal combining contributions from nuclear spin systems of different phase, depending on the local magnetic field of each atomic nucleus.

FIG. 4B shows a phase variant tailored rf pulse which also includes frequencies across the continuous range between $f_a$ and $f_b$. For all of those frequencies, the magnitude is the same, and for frequencies outside that range, the magnitude is zero, as in FIG. 4A. The phase, however, varies linearly across the range between $f_a$ and $f_b$. The phase could vary over a wider or narrower range of values than shown in FIG. 4B. As in FIG. 4A, however, the atomic nuclei of the object will be phase shifted depending on the resonant frequency of the nuclei.

As discussed above in relation to FIG. 2, each of the spectra shown in FIGS. 4A and 4B may be transformed to provide real and imaginary components, which may then be used to modulate an rf pulse applied as shown in FIGS. 5A and 5B. FIG. 5A illustrates a simple example by which a 90° excitation pulse after a tailored rf pulse having spectra like those shown in FIG. 4A results in an FID signal in which spatial information is phase encoded due to the tailored rf pulse applied during gradient G and followed by a 90° excitation pulse. This technique is discussed below in relation to FIG. 7.

If there is no spatial gradient in the local magnetic field during the application of a tailored rf pulse, no spatial encoding will occur but spectroscopic encoding of chemical shift information or field inhomogeneity information will occur. FIG. 5B illustrates an example in which a tailored 180° refocusing pulse having spectra like those shown in FIG. 4B results in an echo signal in which spectroscopic information is phase encoded. A preobservation gradient G is applied before the refocusing pulse so that the echo signal will occur at the center of a subsequent observation pulse G. If this echo signal is sampled, and the samples are stored in a data set which is subsequently transformed, spectroscopic information about the object can be obtained from the phase of the sampled signal. Although the pulse sequence of FIG. 5B is used for spectroscopic encoding, it could be used for spatial encoding by applying a pulsed magnetic field gradient during the tailored refocusing pulse. This gradient, however, must be orthogonal to the gradient G used for observation.

In general, spatial encoding must be done for NMR imaging, and we turn now to further techniques for NMR imaging.

III. NMR Imaging

As noted above, spatial encoding is necessary for NMR imaging. In other words, the locations of the nuclei generating a particular portion of a received NMR signal must be encoded into that signal somehow to permit resolution of the locations of the nuclei. As discussed above, the conventional techniques for spatial encoding using Fourier techniques generally require the application of pulsed magnetic gradient fields. One technique of applying rf pulses according to the present invention, however, makes it possible to perform continuous phase encoding without gradient fields, although rf pulses such as the tailored pulses described above may also be used with pulsed magnetic gradient fields, providing a wide variety of possible imaging techniques.

In order to perform spatial encoding without pulsed magnetic gradient fields, it is necessary to modulate the local spin behavior in some other manner. The necessary variation in the local spin behavior can be provided with an appropriate rf coil which produces an rf field gradient across the imaged region. An rf coil which produces an rf field gradient has previously been used for application of an excitation pulse in the "rotating frame" method of imaging using amplitude encoding as discussed in D. I. Hoult, "Rotating Frame Zeugmatography", *Journal of Magnetic Resonance*, Vol. 33 (1979), pp. 183–197. This aspect of the present invention makes use of such a coil to perform phase encoding for NMR imaging.

Figure 6B:
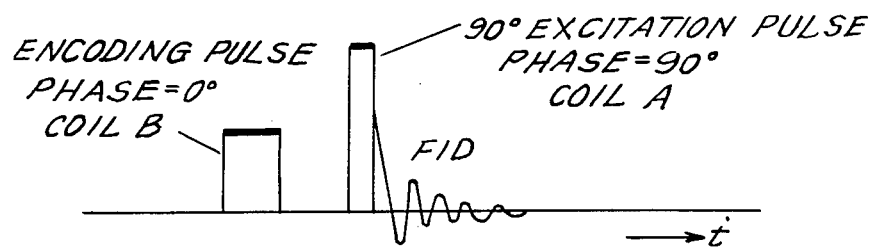
FIG. 6B is a timing diagram showing the application of an rf pulse sequence through the coils of FIG. 6A resulting in phase encoding of information.

FIG. 6A shows an rf coil configuration which can be used to apply an rf gradient field. FIG. 6B is a timing diagram of a pulse sequence applied through the coil configuration of FIG. 6A. FIG. 7 illustrates how the rf gradient field will affect volume elements of an object being imaged. Similar techniques are disclosed in coassigned U.S. application Ser. No., 756,066, entitled "HIGH DYNAMIC RANGE IN NMR DATA ACQUISITION", incorporated herein by reference.

The coil arrangement shown schematically in FIG. 6A includes two rf coils, coil A and coil B. Coil A is a saddle-type coil including two halves 40 and 50 which produce a homogeneous magnetic rf field in the Y direction as shown in FIG. 6A. Coil B, on the other hand, includes two halves 60 and 70 which produce an inhomogeneous magnetic field which could, for example, be a linear gradient along the X direction. Coil B may simply be a standard rf coil like coil A, but rewired so that it produces zero field at the center point between the coil halves 60 and 70. Although coils A and B are shown in orthogonal relationship in FIG. 6A, they need not be orthogonal and may instead lie along the same axis. In addition, additional coils could be provided at different orientations for producing inhomogeneous magnetic rf fields along each of the other directions. The object 80 to be imaged is shown between the coils in FIG. 6A, and it includes three small volume elements of spin magnetized nuclei, A, B, and C.

FIG. 6B shows a simple pulse sequence using the coils of FIG. 6A to produce phase encoding. An inhomogeneous encoding pulse is first applied having a broad band of frequencies. Then a homogeneous 90° excitation pulse is applied, resulting in a FID signal. As discussed below, the phase encoding pulse of the FID signal is complete only when both of these pulses have been applied, even though we refer to the first pulse as an encoding pulse.

FIG. 7 illustrates how the rf pulse sequence of FIG. 6 will affect the spin magnetization in each of the volume elements A, B, and C. A similar effect will result from the pulse sequence of FIG. 5A, in which, as in FIG. 6B, the tailored encoding pulse is 90° ahead of the excitation pulse in phase. In the first line of FIG. 7, the three volume elements are shown oriented along the Z′ axis, the position which they would take as a result of the static magnetic field on the Z′ axis. Then, as shown in the second line of FIG. 7, an rf pulse applied through coil B changes the orientation of the spin in some of the volume elements. Treating the spin behavior in a rotating frame of reference at the rf reference frequency $f_0$, this pulse is applied along the X′ axis, which is arbitrarily assigned to have a phase of zero. As a result, the spin axis of volume element A is rotated toward the positive Y′ axis, while the spin axis of volume element C is rotated in the opposite direction toward the negative Y′ axis. The spin axis of volume element B is unaffected, however, because, as noted above, a zero rf field is produced at the center point between coil halves 60 and 70. As can be seen from FIG. 7, this will result in a spatial variation of the spin axis orientations of the volume elements, since the orientation of the spin axis in each volume element will now be distinct from that of volume elements at other points along the X′ axis.

Immediately after the end of the encoding pulse applied through coil B, a 90° excitation pulse is applied through coil A, as shown in the third line of FIG. 7. This pulse is applied along the Y′ axis, at a phase of 90° relative to the X′ axis, so that it tips all of the spin axes out of the Y′-Z′ plane into the X′-Y′ plane. The spins will be tipped into the X′-Y′ plane with different phase, however, effectively completing the phase encoding. Furthermore, the excited nuclei will decay, producing a FID signal, as discussed above in relation to FIG. 5A. This FID may be detected by a receiver coil, and coil A of FIG. 6A is a suitable receiver coil.

FIGS. 8–10 illustrate more complicated sequences making use of the basic phase encoding techniques discussed above. FIG. 8 shows a sequence in which broadband encoding pulses are applied through inhomogeneous rf coils. FIG. 9 shows a sequence in which linearly varying tailored rf pulses are applied through homogeneous rf coils in the presence of pulsed magnetic field gradients. FIG. 10 shows a sequence in which a slice selective tailored rf pulse is applied through an inhomogeneous rf coil in the presence of a gradient field. Therefore, the sequences of FIGS. 8 and 9 may be used in three-dimensional imaging while the sequence of FIG. 10 may be used in two-dimensional imaging.

The pulse sequence of FIG. 8 makes use of three inhomogeneous rf coils like coil B in FIG. 6A to perform three dimensional spectroscopic imaging without pulsed magnetic gradient fields. Instead, a broadband rf encoding pulse is applied through each of the three inhomogeneous coils to provide a variation in amplitude in each of the three spatial dimensions. In FIG. 8, the pulses are shown in sequence, but they could all be applied at once. These pulses are preferably all applied along the X' axis in the rotating frame, i.e., with phase equal to zero, as indicated in FIG. 8, after which a 90° excitation pulse is applied along the Y' axis, i.e., with phase equal to 90°, in order to tip all of the spins into the X'-Y' plane to complete the phase encoding, as in FIG. 7. As a result, an FID signal will occur containing three-dimensional spatial information as well as spectroscopic information. This signal may be sampled and stored in a data set. In order to obtain a complete data set for imaging, however, it is necessary to apply the amplitude variant pulses at a number of amplitudes in the manner of Fourier imaging techniques, as indicated in FIG. 8. From the complete data set, the three-dimensional image with spectroscopic information can be obtained by a transform such as a Fourier transform.

Because the sequence of FIG. 8 requires that the broadband rf encoding pulses be applied at a number of amplitudes, the time required for making the necessary measurements and for the subsequent data processing is larger than for most forms of NMR imaging. The sequence of FIG. 8 may be advantageous, however, for the observation of sodium relaxation and chemical shift information. In this application, it is desirable to observe contributions resulting from short $T_2$ decay times, and this is made possible by the direct observation of the FID, which would not be possible with the more common spin echo technique commonly used for Fourier imaging. In addition, the short $T_1$ decay time for sodium permits a short repetition period between successive measurements, making the acquisition of a large number of measurements less burdensome. At the same time, however, the $T_2$ time is relatively short, so that relaxation effects occurring during the rf phase encoding pulses prior to observation must be taken into account in the subsequent processing.

FIG. 9 shows a pulse and gradient switching sequence very similar to that of FIG. 8, but in which tailored amplitude variant pulses are applied during respective pulsed magnetic field gradients $G_x$, $G_y$ and $G_z$. In this embodiment, the amplitude variant pulses may be applied with a single rf coil producing a homogeneous field distribution. Once again, the three amplitude variant pulses are applied with the same phase, so that they are all applied along the X' axis. The subsequent 90° excitation pulse is applied along the Y' axis, 90° out of phase with the amplitude variant pulses, so that it flips the spins into the X'-Y' plane, as in FIG. 7. The phase encoding can be incremented for successive measurements by changing the gain used for each of the amplitude variant pulses, by changing the gradient strength for each of the pulsed magnetic gradient fields, or by changing the phase change per unit of frequency in the magnitude spectrum of the amplitude variant pulses. As in FIG. 8, the resulting FID may be sampled and stored in a data set, and this pulse and gradient switching sequence may also be appropriate for sodium chemical shift observation, but once again the relaxation effects during the phase encoding must be taken into account.

FIG. 10 shows another application of the amplitude variant pulse of the present invention, this time to perform multiple plane two-dimensional imaging, also referred to as two-dimensional multislice imaging. A tailored amplitude variant pulse and a subsequent tailored 90° excitation pulse are applied to select a limited region of the object in order to obtain a two-dimensional image rather than a three-dimensional image, and this is accomplished by applying these pulses in the presence of a slice selective gradient along the Gz axis. First, the amplitude variant pulse is applied through coil B, producing an rf field gradient affecting the atomic nuclei in the slice. Then, the homogeneous 90° excitation pulse is applied through coil A to tip the spin axes in the slice into the X'-Y' plane. A preobservation pulse of gradient $G_y$ is applied, after which a 180° refocusing pulse is applied through coil A along the X' axis, resulting in a spin echo observed during a subsequent observation gradient pulse in $G_y$. Once again, a complete data set may be obtained by varying the gain used for the amplitude variant pulse, the selective gradient pulse strength, or the phase change per unit frequency of the amplitude variant pulse. In addition, this pulse and gradient switching sequence may be varied for three-dimensional imaging or to produce additional spin echo signals at later time periods.

The pulse and gradient switching sequences of FIGS. 8, 9 and 10 are merely a few examples of the multitude of possible phase encoding sequences making use of rf pulses according to the present invention. The phase encoding techniques according to the invention may also be used in conjunction with surface coil techniques and, as discussed above, may be used in commercial high-resolution spectrometer systems for imaging without providing a full set of field gradient coils and power supplies.

The tailored phase variant pulses with spectra as in FIG. 4B are not used in any of the sequences in FIGS. 8–10, but may also be used for specific examples of phase encoding. Because a phase variant pulse along one spatial axis cannot be spatially selective along an orthogonal axis, the phase variant pulse is not well suited for multislice imaging. It may, however, be useful in volume imaging and for single plane spectroscopic imaging in which a time delayed selective refocusing pulse is used to enable slice selection along with phase encoding of spectroscopic information. The sequence of FIG. 5B uses a tailored non-selective phase variant 180° refocusing pulse, but could be modified for slice selection. A phase variant 90° excitation pulse may also be applied to perform phase encoding of spectroscopic information, with slice selection or additional spatial encoding being performed later.

IV. Miscellaneous

As noted above, the rf pulses may be used in a wide variety of sequences for phase encoding spatial and spectroscopic information. If a tailored rf pulse is used, the resolution in each of the encoding dimensions may be software programmable in that the magnitude or phase which varies across the frequency range of the pulse can be changed at will. In conventional Fourier imaging using pulsed magnetic field gradients, the spatial resolution in the encoding dimension depends directly on the number of independent phase encoding measurements made, and this resolution is constant across that dimension, so that it is not possible to image a limited region with increased resolution. With the tailored rf pulses, however, it is possible to program the phase encoding increment per point to be greater over a selected region, making it possible to obtain an image with varying spatial resolution, providing a sort of "zoom" capability.

In general, the above description relates to the phase encoding of spatial and spectroscopic information. The rf pulses may, however, be used for encoding other types of information, such as information discriminating flow of velocities of fluids in an object. This might be done by measuring differences following the application of spatially dependent excitation and refocusing pulses.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

I claim:

1. A method of retrieving phase encoded NMR information from an object comprising:
    exciting and phase encoding nuclei in the object to provide a phase encoded NMR signal by producing a substantially continuous phase variation across a range of resonant frequencies of the nuclei, the step of exciting and phase encoding comprising applying an rf pulse with a substantially continuous frequency range covering said range of resonant frequencies of the nuclei, said rf pulse being applied with a respective magnitude and a respective phase at each frequency of the frequency range, one of the respective magnitude and the respective phases varying with frequency and
    receiving the phase encoded NMR signal.

2. The method of claim 1 in which the respective phases of the spin resonance frequencies are made to vary with frequency by the application of said rf pulse in which the respective phases of the frequencies of the frequency range vary with frequency and the respective magnitudes of the frequencies of the frequency range are all the same, whereby the nuclei are phase encoded and the spin axes of the nuclei are brought into an orientation traverse to a static magnetic field, thereby producing the phase variation in the transverse direction.

3. The method of claim 1 in which the respective phases of the spin resonance frequencies are made to vary with frequency by the application of said rf pulse in which the respective magnitudes of the frequencies of the frequency range vary with frequency and the respective phases of the frequencies of the frequency range are all equal, and in which the step of phase encoding further comprises applying an excitation pulse to bring the spin axes of the nuclei into an orientation transverse to a static magnetic field, thereby producing the phase variation in the transverse orientation.

4. The method of claim 1 in which the substep of applying an rf pulse comprises applying an rf pulse through an inhomogeneous coil to produce an rf gradient field across the object.

5. The method of claim, 4 in which the rf gradient field is zero at a point within the object.

6. The method of claim 4 in which the rf pulse applied through the inhomogeneous coil has a respective magnitude across the frequency range, the respective magnitude varying with frequency.

7. The method of claim 1 in which the substep of applying an rf pulse comprises applying an rf pulse through an inhomogeneous coil to produce an rf gradient field across the object.

8. The method of claim 1 in which the step of phase encoding nuclei comprises phase encoding spatial information about the nuclei, the phase encoded NMR signal further including spectroscopic information about the nuclei, the step of receiving the NMR signal comprising receiving both the spatial and the spectroscopic information.

9. The method of claim 8 in which the substep of applying an rf pulse comprises applying an rf pulse with a respective magnitude and a respective phase at each frequency of the frequency range, one of the respective magnitude and the respective phase varying with frequency.

10. The method of claim 8 in which the substep of applying an rf pulse comprises applying an rf pulse through an inhomogeneous coil to produce an rf gradient field across the object.

11. A method of retrieving phase encoded NMR information from an object comprising:
    exciting and phase encoding nuclei in the object to provide a phase encoded NMR signal by producing a substantially continuous phase variation across a range of resonant frequencies of the nuclei, the step of exciting and phase encoding comprising applying an rf pulse to the nuclei, the rf pulse including a plurality of frequencies, each frequency of the pulse having a respective magnitude and a respective phase, one of the respective magnitude and the respective phases varying with frequency; and
    receiving the phase encoded NMR signal.

12. The method of claim 11 in which the frequencies of the rf pulse cover a continuous range of frequencies, and the respective phases of the spin resonance frequencies are made to vary with frequency by the application of said rf pulse in which the respective phases of the frequencies in the continuous range vary with frequency and the frequencies of the continuous range all have the same respective magnitude.

13. The method of claim 11 in which the frequencies of the rf pulse cover a continuous range of frequencies, and the respective phases of the spin resonance frequencies are made to vary with frequency by the application of said rf pulse in which the respective magnitudes of the frequencies in the continuous range vary with frequency, and the frequencies of the continuous range all have the same phase.

14. The method of claim 11 further comprising defining the respective magnitudes and phases of the frequencies and transforming the defined respective magnitudes and phases to obtain time-varying real and imaginary components.

* * * * *